United States Patent
Cok (10) Patent No.: US 7,638,941 B2
(45) Date of Patent: Dec. 29, 2009

(54) LAMP WITH MULTI-COLORED OLED ELEMENTS

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 690 days.

(21) Appl. No.: 11/292,829

(22) Filed: Dec. 2, 2005

(65) Prior Publication Data

US 2007/0126004 A1    Jun. 7, 2007

(51) Int. Cl.
*H01J 1/62*    (2006.01)
*H01J 63/04*    (2006.01)

(52) U.S. Cl. .................. 313/506; 313/504; 313/498; 313/501; 257/59; 362/226; 362/84; 428/690

(58) Field of Classification Search .............. 313/506; 428/690
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 6,565,231 B1 | 5/2003 | Cok | |
| 6,670,772 B1 | 12/2003 | Arnold et al. | |
| 6,680,570 B2 | 1/2004 | Roitman et al. | |
| 6,787,976 B2 * | 9/2004 | Minoura et al. | 313/110 |
| 6,917,159 B2 | 7/2005 | Tyan et al. | |
| 2003/0170491 A1 | 9/2003 | Liao et al. | |
| 2004/0052076 A1 | 3/2004 | Mueller et al. | |
| 2004/0090787 A1 | 5/2004 | Dowling et al. | |
| 2004/0105264 A1 | 6/2004 | Spero | |
| 2004/0135160 A1 * | 7/2004 | Cok | 257/88 |
| 2004/0140757 A1 | 7/2004 | Tyan et al. | |
| 2004/0149984 A1 | 8/2004 | Tyan et al. | |
| 2004/0155576 A1 | 8/2004 | Tyan et al. | |
| 2004/0160172 A1 * | 8/2004 | Tyan et al. | 313/506 |
| 2005/0073228 A1 | 4/2005 | Tyan et al. | |
| 2006/0006795 A1 * | 1/2006 | Strip | 313/504 |

FOREIGN PATENT DOCUMENTS

| | | | |
|---|---|---|---|
| JP | 11174214 A | * | 7/1999 |
| WO | WO 99/57945 | | 11/1999 |

* cited by examiner

*Primary Examiner*—Sikha Roy
(74) *Attorney, Agent, or Firm*—Roland R. Schindler; Raymond L. Owens (57) ABSTRACT

Solid-state area illumination stems and method for forming such systems are provided. The illumination system comprises: a plurality of OLED devices each device formed on a separate substrate and each device emitting light at a plurality of angles relative to the substrate, the emitted light having different ranges of frequencies at different ranges of the plurality of angles; and a support positioning each of the plurality of OLED devices at a plurality of orientations relative to an area of illumination, the positioning being defined so that any point on any surface within the area of illumination will receive a broadband combination of light from more than one of the OLED devices.

15 Claims, 6 Drawing Sheets

(PRIOR ART)

US 7,638,941 B2

LAMP WITH MULTI-COLORED OLED ELEMENTS

CROSS-REFERENCE TO RELATED APPLICATIONS

Reference is made to commonly assigned, co-pending patent application U.S. Application Publication Nos. 2004/0149984 entitled COLOR OLED DISPLAY WITH IMPROVED EMISSION filed Jan. 31, 2003 in the names of Tyan et al.; U.S. 2004/0140757 entitled MICROCAVITY OLED DEVICES filed Jan. 17, 2003 in the names of Tyan et al.; U.S. 2005/0073228 entitled WHITE-EMITTING MICROCAVITY OLED DEVICE filed Oct. 7, 2003 in the names Tyan et al.; and U.S. Pat. No. 6,917,159 entitled MICROCAVITY OLED DEVICE filed Aug. 14, 2003 in the names of Tyan et al.

FIELD OF THE INVENTION

The present invention relates to the use of organic light emitting diodes for area illumination, and more particularly to broadband illumination using colored light emitters.

BACKGROUND OF THE INVENTION

Solid-state lighting devices made of light emitting diodes (LEDs) are increasingly useful for applications requiring robustness and long-life. For example, solid-state LEDs are found today in automotive applications. These devices are typically formed by combining multiple, small LED devices providing a point light source into a single module together with glass lenses or reflectors suitably designed to direct the light as is desired for a particular application; see for example, WO99/57945, published Nov. 11, 1999. These multiple devices are expensive and complex to manufacture and integrate into single illumination devices. Moreover, point sources of light such as LEDs or incandescent lamps tend to require additional light diffusers, e.g. lampshades, to avoid glare.

Organic light emitting diodes (OLEDs) are manufactured by depositing organic semiconductor materials between electrodes on a substrate. This process enables the creation of area-emitting light sources having an extended light emitting surface area on a single substrate, thereby reducing glare and improving the efficiency of illumination. The prior art describes the use of one or more OLEDs in lighting, for example U.S. Pat. No. 6,565,231, entitled OLED Area Illumination Lighting Apparatus filed by Cok on May 28, 2002. In particular, the use of specially constructed layers within an OLED device to form optical cavities that can enhance the amount of light output from an OLED device is known. For example, U.S. Application Publication No. 2004/0155576 filed Feb. 4, 2004, entitled "Microcavity OLED Devices" describes such an OLED device. Other means, such as diffraction gratings can be employed to similar effect. Because these layers in these devices provide an optical filtering effect, the layers are carefully selected to minimize frequency dependence on the angle of emission for the emitted light. Alternatively, scattering or diffusing elements are employed to maintain a consistent color of light emitted over the surface of the OLED device and at any viewed angle.

It will be appreciated that these techniques involve filtering, reflecting or otherwise processing light generated by the OLED device and that with each such processing step, a portion of the light generated by the OLED device can be subject to optical losses thus, the overall efficiency of such an illumination system as measured in terms of lumens per watt of supplied energy may decrease. It will further be appreciated that the efficiency of an area illumination system can be a critical feature in the selection of one form of area illumination as compared against other potential forms of area illumination, particularly, where vast areas such as roadways, athletic stadiums, or other areas are to be illuminated.

Another critical factor in the selection of an area illumination system is the aesthetic appeal or lack thereof of the selected area illumination system itself. Colored lights are sometimes employed as decoration or specialty lighting, for example as holiday lighting. Colored illumination is typically provided using filters over white-light lamps. See for example, US 2004/0090787 entitled "Methods and Systems for Illuminating Environments" published May 13, 2004; US 2004/0052076 entitled "Controlled Lighting Methods and Apparatus" published Mar. 18, 2004; and US 2004/0105264 "Multiple Light-Source Illuminating System", published Jun. 3, 2004. However, it will be appreciated that here too, the filters absorb light, reduce the efficiency of the illumination system and cause the area illuminated thereby to take on the colors of the filtered light.

There is a need therefore for an improved solid-state flat-panel area-emitting lighting apparatus that provides an aesthetically pleasing environment and a usable, broadband illumination.

SUMMARY OF THE INVENTION

In one aspect of the invention, a solid-state area illumination system is provided. The illumination system comprises: a plurality of OLED devices each device formed on a separate substrate and each device emitting light at a plurality of angles relative to the substrate, the emitted light having different ranges of frequencies at different ranges of the plurality of angles; and a support positioning each of the plurality of OLED devices at a plurality of orientations relative to an area of illumination, the positioning being defined so that any point on any surface within the area of illumination will receive a broadband combination of light from more than one of the OLED devices.

In another aspect of the invention, a solid-state illumination system is provided that comprises: a plurality of OLED devices each device formed on a separate substrate and each device emitting light at a plurality of angles relative to the substrate, the emitted light having different ranges of frequencies at different ranges of the plurality of angles; with each OLED device including a first electrode formed over the substrate and a second electrode with at least one of the first electrode and second electrode having a surface that is at least partially reflective and having at least one layer of light emitting organic material formed between the first electrode and second electrode, the at least one light emitting organic material layer emitting light at a plurality of angles relative to the normal of the at least one layer of organic material; wherein the electrodes and the at least one layer of organic material are formed so that the distance that emitted light travels from the light emitting layer to the at least one partially reflective surface varies depending on the angle of emission so that the frequency of light emitted from the OLED device to an illuminated surface depends upon the emission angle. A support positions the plurality of OLED devices at a plurality of orientations relative to an area of illumination, the positioning being defined so that any illuminated point on any surface within the area of illumination will receive a substantially common broadband combination of light from more than one of the plurality of OLED devices.

In yet another aspect of the invention, a method of forming a solid-state illumination system is provided. The illumination system comprises the steps of: forming a plurality of OLED devices on separate substrates, each device emitting light at a plurality of angles relative to the substrate, the emitted light having different ranges of frequencies at different ranges of the plurality of angles; and providing a support for positioning the plurality of OLED devices at a plurality of orientations relative to an area of illumination, the positioning being defined so that any point on any surface within the area of illumination will receive a generally homogeneous broadband combination of light from more than one of the OLED devices.

ADVANTAGES

The present invention has the advantage of providing a solid-state flat-panel decorative color lamp providing white-light illumination.

It will be understood that the figures are not to scale since the individual layers are too thin and the thickness differences of various layers too great to permit depiction to scale.

DETAILED DESCRIPTION OF THE INVENTION

Figure 1:
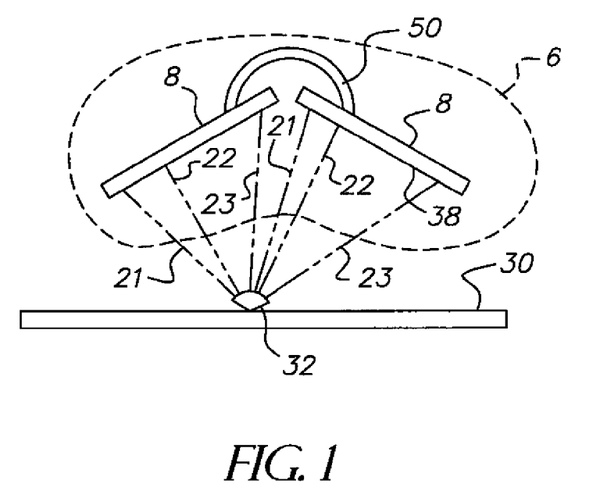
FIG. 1 is a schematic illustration of one embodiment of a solid-state illumination assembly.
Figure 2:
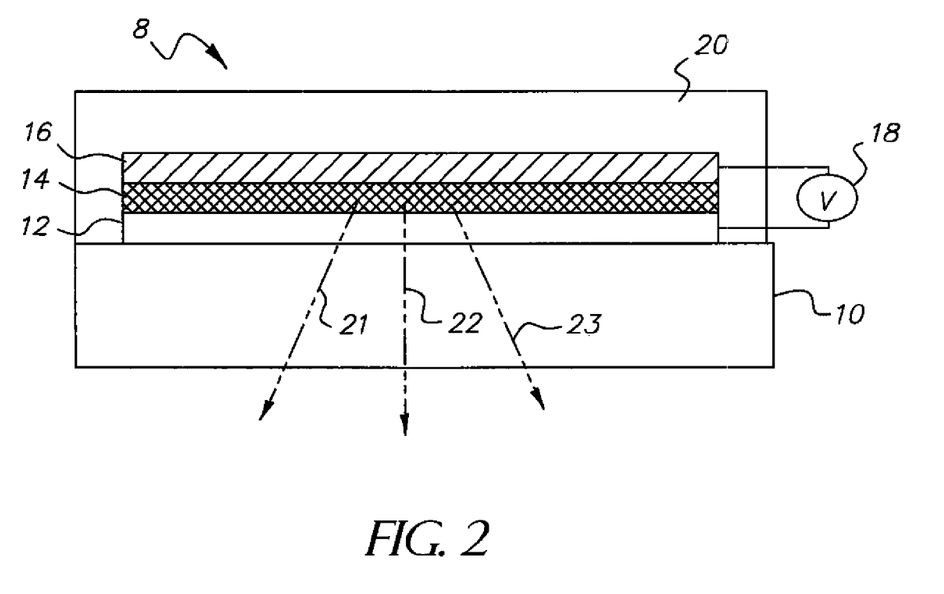
FIG. 2 illustrates a partial cross section of one embodiment of an OLED device.
Figure 4:
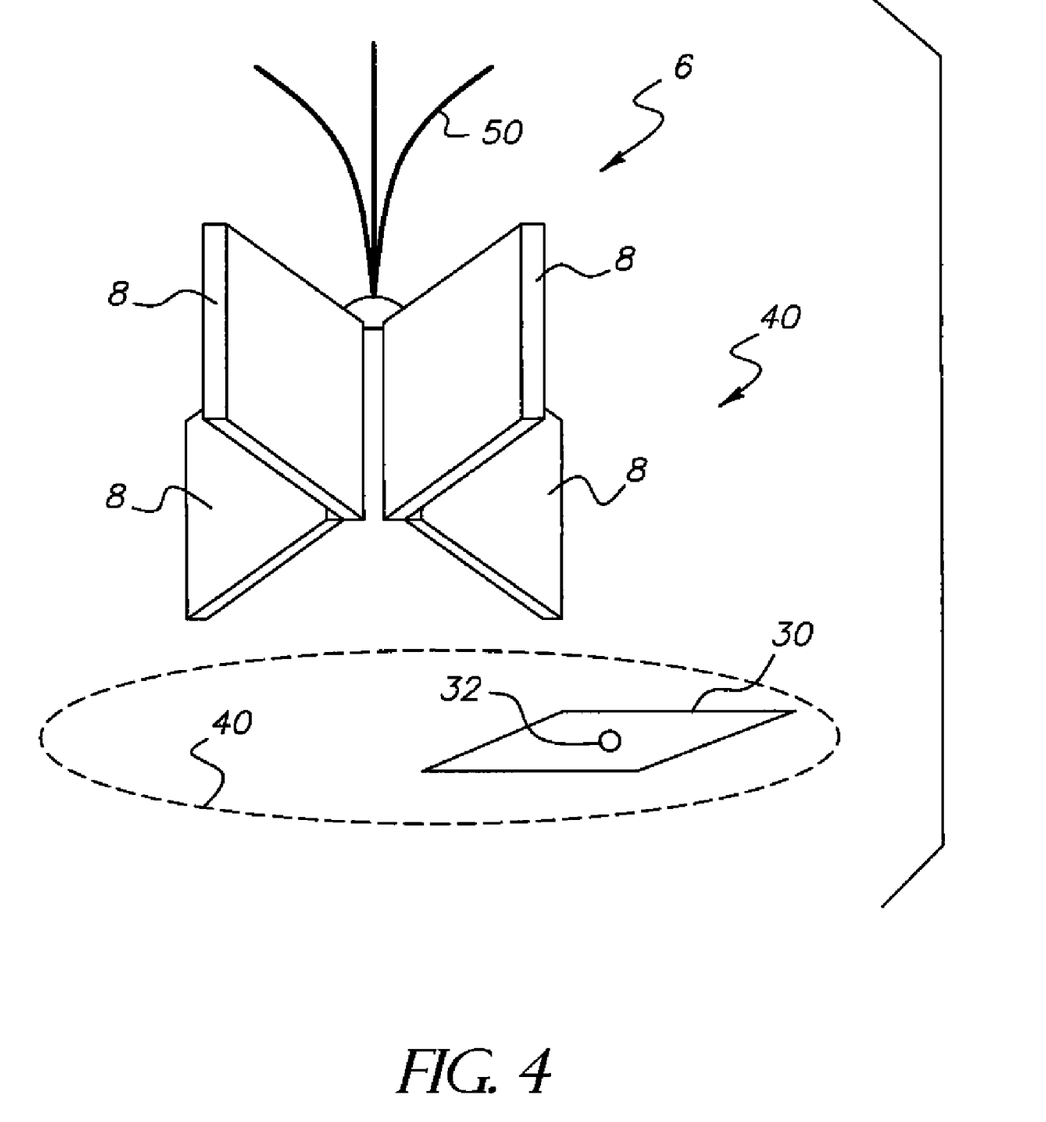
FIG. 4 is a perspective view of an embodiment of a solid-state illumination system.
Figure 5:
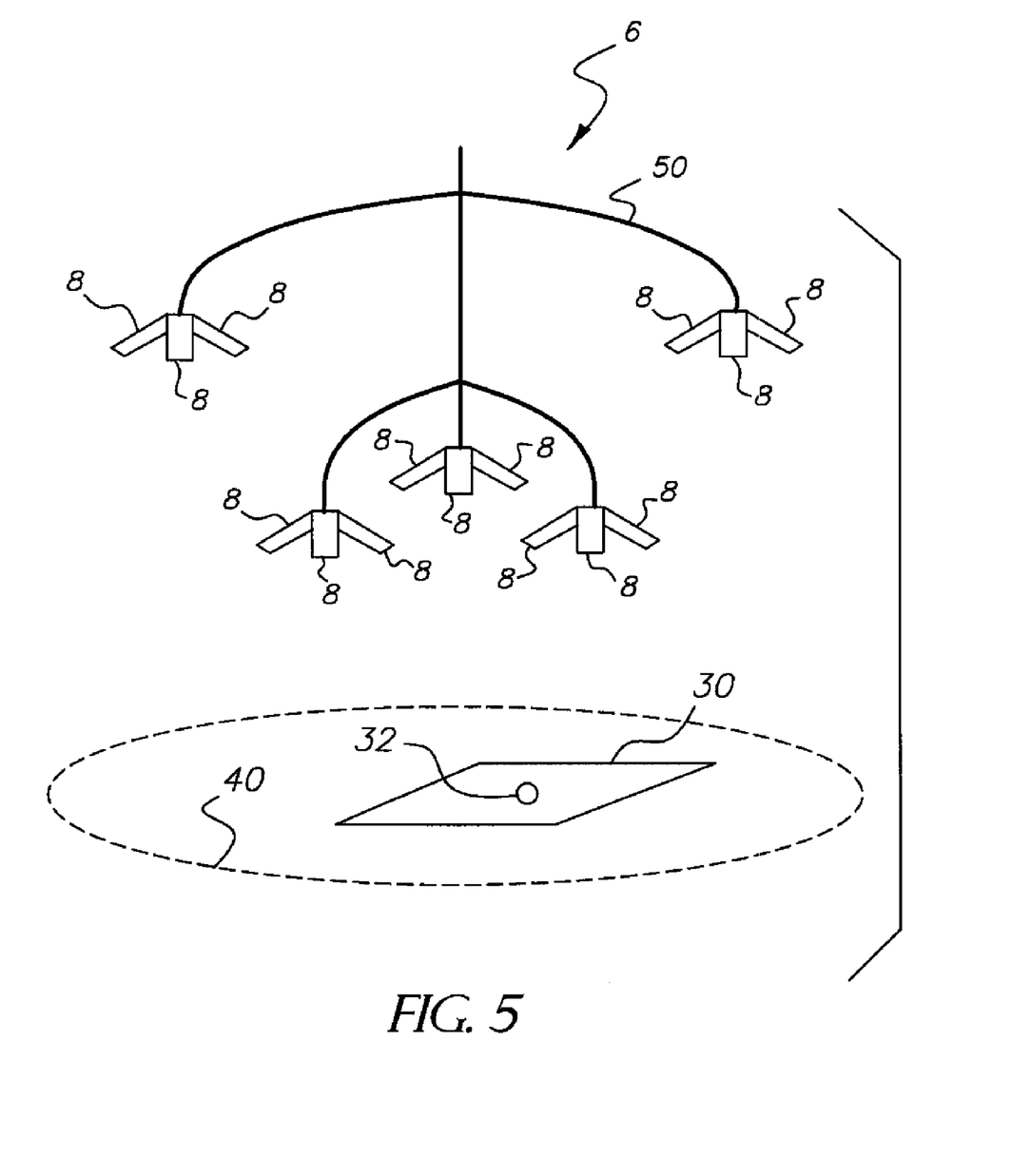
FIG. 5 is a perspective view of an alternative embodiment of the present invention.

Referring to FIGS. 1, 2, and 5, one embodiment of a solid-state area illumination system is illustrated. In the embodiment of FIG. 1, solid-state illumination system 6 comprises a plurality of OLED devices 8, each OLED device 8 is formed on a separate substrate 10. Each OLED device 8 has a first electrode 12 formed over the substrate 10 with one or more layers of organic material 14 formed or otherwise provided on the first electrode 12 and with a second electrode 16 formed or otherwise provided over the one or more layers of organic material 14. In the embodiment illustrated, an encapsulating cover 20 is provided as an outer layer. The organic material 14 emits light (21, 22, 23) at a plurality of angles relative to substrate 10. The emitted light has different ranges of frequencies at different ranges of the plurality of angles. The frequency of light emitted depends on the angle of emission with respect to substrate 10. As shown in the example embodiments of FIGS. 3, 4 and 5, a support 50 positions the plurality of OLED devices 8 at a plurality of orientations relative to an area of illumination 40. The positioning is such that any point 32 on any illuminated surface 30 within area of illumination 40 will receive a broadband combination of different frequencies of light from more than one of the plurality of OLED devices 8. As used herein, broadband light is any light that combines two discernibly different colors of light. The broadband light can be generally white in appearance and may have a desired white point or color rendition index (CRI). If desired, the broadband light can also have a colored appearance.

Referring to FIG. 2, upon application of a voltage 18 across electrodes 12 and 16, current flows through organic material 14 and organic material 14 emits light. Either or both the substrate 10 and cover 20 can be transparent or otherwise less than fully opaque, while at least one of the first electrode 12 and second electrode 16 can be at least partially transparent to allow light emitted by organic material 14 to escape from OLED device 8. Depending on which electrode is at least partially transparent and on the extent of transparence of the substrate 10 or cover 20, light will be emitted through either or both substrate 10 and cover 20. If only one electrode is partially transparent or transparent, the other electrode is typically reflective.

The frequency of light emitted from each OLED device 8 has a dependence on the angle of emission that can be created by any of a variety of techniques. For example, such angular dependence can be created by forming a one-dimensional or a two-dimensional grating, a photonic crystal structure, and/or a surface plasmon structures on one of the electrodes. Diffraction gratings have been proposed to control the attributes of light emission from thin polymer films by inducing Bragg scattering of light that is guided laterally through the emissive layers; see "Modification of Polymer Light Emission by Lateral Microstructure" by Safonov et al., Synthetic Metals 116, 2001, pp. 145-148, and "Bragg Scattering from Periodically Micro-structured Light Emitting Diodes" by Lupton et al., Applied Physics Letters, Vol. 77, No. 21, Nov. 20, 2000, pp. 3340-3342. U.S. Pat. No. 6,670,777 issued Dec. 30, 2003 describes a surface plasmon method for improving light output. These techniques typically rely upon a reflective electrode having a surface with a variable distance from a transparent or semi-reflective electrode.

Figure 6A:
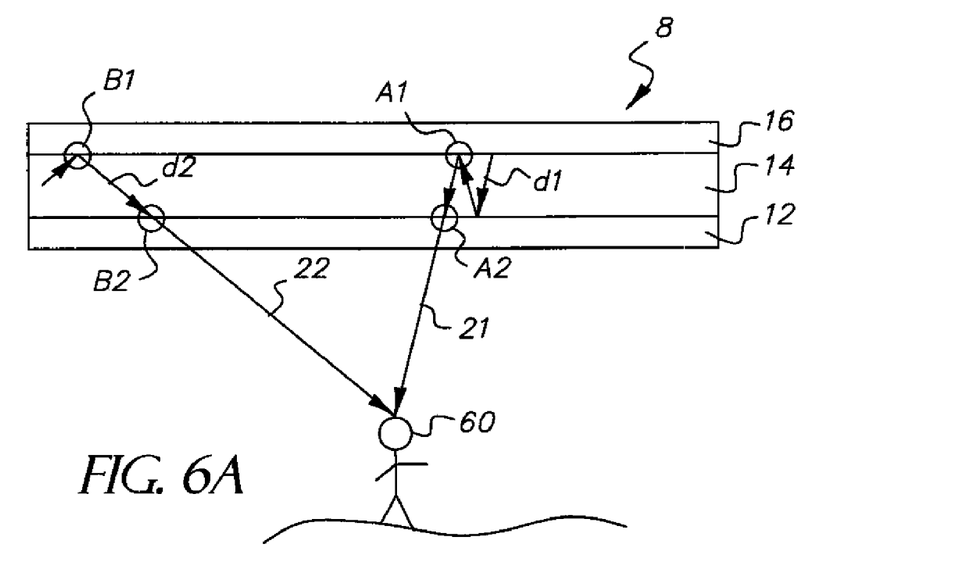
FIG. 6A illustrates a pattern of reflection within one embodiment of an OLED device.
Figure 6B:
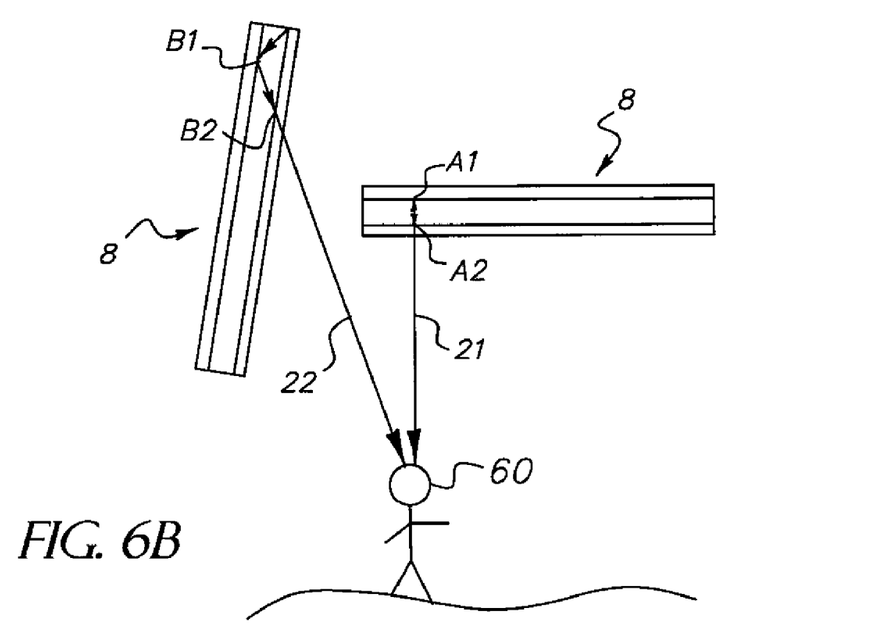
FIG. 6B illustrates a pattern of reflection within one embodiment of a plurality of OLED devices.

OLED devices 8 that use micro-cavity structures also emit light at a plurality of angles with the emitted light having a frequency that depends upon the angle of emission, see for example U.S. Pat. No. 6,680,570 issued Jan. 20, 2004 and "Sharply Directed Emission in Organic Electroluminescent Diodes with an Optical-Microcavity Structure" by Tsutsui et al., Applied Physics Letters 65, No. 15, Oct. 10, 1994, pp. 1868-1870. This technique relies upon a reflective electrode and a semi-reflective electrode. Referring to FIGS. 6A and 6B, what is shown is one embodiment of an OLED device 8 that uses a microcavity structure and can comprise, for example, a reflective electrode 16; a semi-reflective electrode 12 with one or more layers of light emitting organic material 14 formed between the reflective and semi-reflective electrodes, the light emitting organic material being operable to emit light at a plurality of angles relative to the normal of the one or more layers of organic material. In this example, electrodes 12, 16 and organic material 14 are arranged to cause emitted light to travel a distance from organic material 14 to the at least partially reflective surface that varies based upon the angle of emission. For example, referring to FIG. 6A, light ray 21 is emitted in layer 14 and reflects between the reflective and semi-reflective electrodes 16 and 12 before it passes through electrode 12 and is seen by a viewer 60. Points A1 and A2 on the two electrodes illustrate the path of light ray 21 and define the length of the optical cavity and, hence, the frequency of the light emitted. Similarly, the optical cavity corresponding to light ray 22 is illustrated with points B1 and B2. Since the distance between B1 and B2 is different from the distance between A1 and A2, the frequency of light seen by the viewer 60 will likewise differ. This difference will be largest if the OLED device 8 is very close to viewer 60 and light ray 21 is emitted nearest the viewer 60 and light ray 22 is emitted farthest from the viewer 60. This arrangement however, is not well-suited for providing broadband illumination over an area of illumination that can extend over a range of distances from OLED device 8. In the embodiment illustrated in FIG. 6B, OLED devices 8 are positioned at different angles. This difference in angle creates a difference in optical cavity length and causes the frequency of the light radiated by the OLED devices to vary based upon the angular orientation of the OLED devices 8. For example, light ray 21 may be blue, while light ray 22 may be green or red. The extent of the color shift is dependent upon structural features of OLED device 8 including, but not limited to, the extent of the separation between electrodes 12 and 16, the reflectivity of electrodes 12 and 16 in microcavity type OLED devices, the OLED material 14 layer thicknesses, and the arrangement of grating structures, polytonic crystal structures and/or surface plasmon structures used in conjunction with OLEDs. Similarly, it will be appreciated that the selection of materials used in OLED devices 8 can impact the extent of the color shift variation. It will also be appreciated that such factors can also influence the overall set of frequencies of light emitted by an OLED device, such that the set of frequencies of light emitted by any one of the plurality of OLED devices 8 used in an illumination device 6 can differ from the set emitted by other OLED devices 8. For example, some OLED devices 8 can emit a broader range of frequencies of light than others.

In prior-art OLED devices, this angular dependence effect is detrimental to the performance of a display or illumination device and is defeated through scattering layers or careful optimization of layers in the device to minimize the effect. However, in the present invention, this effect is employed to useful effect. Means to create such effects employing microcavities are also described in U.S. Application Publication Nos. 2004/0149984 filed Jan. 31, 2003 in the names of Tyan et al., entitled "Color OLED Display with Improved Emission"; U.S. 2004/0140757 filed Jan. 17, 2003 in the names of Tyan et al., entitled "Microcavity OLED Devices"; U.S. 2005/0073228 filed Oct. 7, 2003 in the names Tyan et al., entitled "White-Emitting Microcavity OLED Device"; U.S. Pat. No. 6,917,159 filed Aug. 14, 2003 in the names of Tyan et al., entitled "Microcavity OLED Device", and references found therein.

Figure 7:
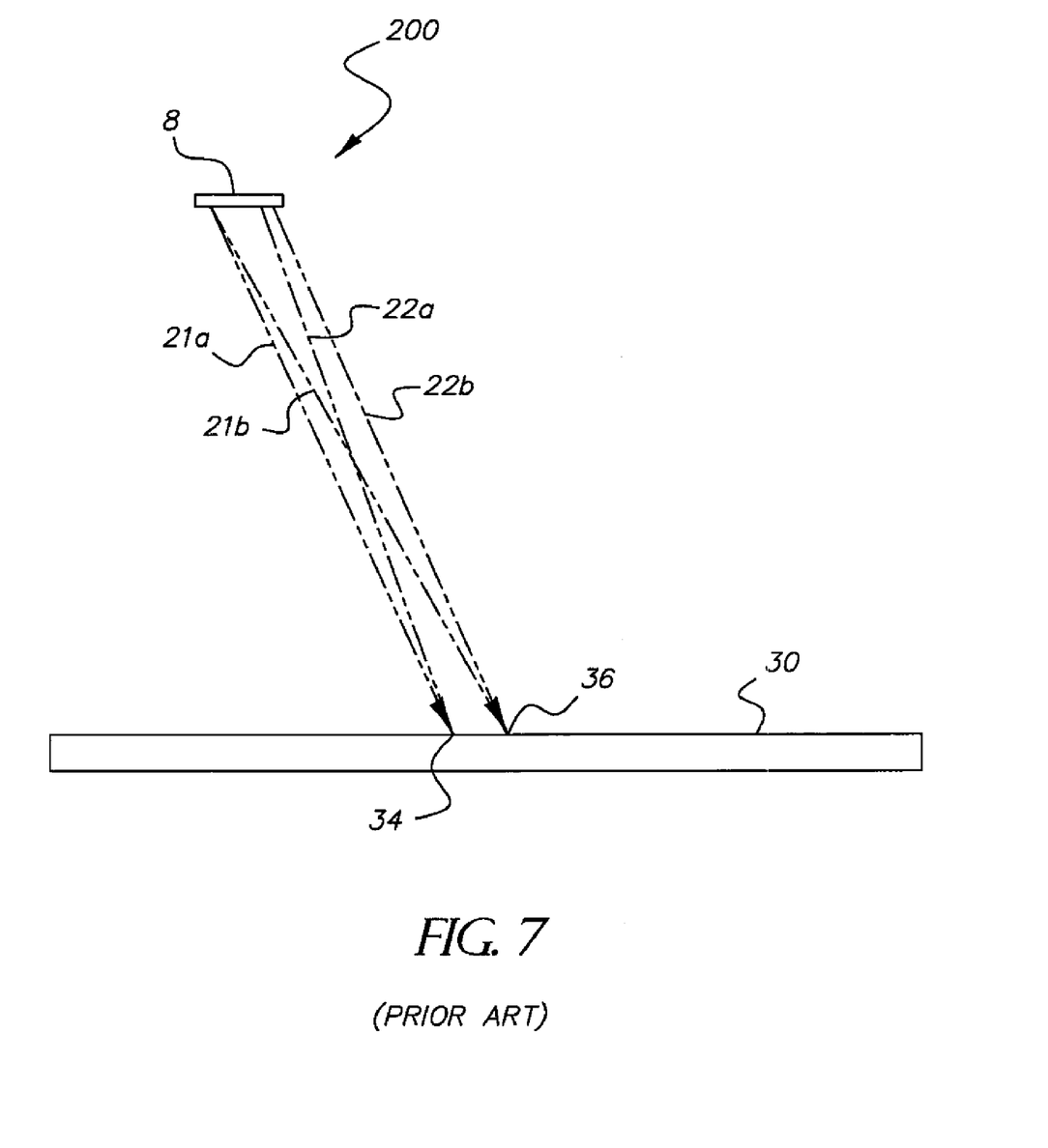
FIG. 7 illustrates a prior-art embodiment of an area illumination system.

Referring to FIG. 7, a prior-art illumination system 200 using a single OLED device 8 is illustrated being positioned at a distance from an illuminated surface 30 and emits colored light of one frequency to a point 34 on the illuminated surface 30 via light ray 21*a* and colored light of another frequency to a different point 36 on the illuminated surface 30 via light ray 21*b*. Although light rays 21*a* and 21*b* are not emitted at precisely the same angle from the substrate of OLED device 8 (and similarly for light rays 22*a* and 22*b* illuminating point 36), because the substrate of the OLED device 8 is relatively small with respect to the distance from the OLED device 8 to points 34 or 36 on illuminated surface 30, all of the light rays emitted from the OLED device 8 that are directed toward a common point will be very nearly parallel so that the points 34 and 36 on the illuminated surface 30 will each be illuminated with light of a particular, nearly identical color. Hence, a practical prior-art illumination system 200 using a single OLED device 8 will not provide broadband illumination on a single point 34 or 36 on the illuminated surface 30. Accordingly, as is described above, various prior-art methods have been developed to help reduce the angular variation of light from a single OLED device and to employ a white-light emitting organic materials 14 in the OLED device.

Referring again to FIGS. 1 and 3, an illumination system 6 provides a generally more homogeneous broadband light to all points within area of illumination 40 without use of the prior-art methods. The illuminated point 32 is illuminated from at least two different OLED devices 8 oriented at different angles with respect to the point 32. As used herein, oriented at different angles means that a normal to the illuminated surface forms different angles with respect to the normal of at least one of the OLED devices 8, whether the normals are in the same plane or not. Although the preponderance of the light from any one of the OLED devices 8 may be emitted at approximately the same angle and have approximately the same frequency due to the distance between OLED device 8 and illuminated point 32, as illustrated in FIG. 7, at least a second one of the plurality of OLED devices 8 will be at a different angle and will therefore illuminate point 32 with a different color. The combination of colors, particularly if many OLED devices are employed at different angles, will illuminate surfaces within an area of illumination 40 with a more acceptable, broadband, illuminating light. Thus, while the color of light from any particular OLED device 8 received at any point in area of illumination 40 will likely be within a narrow range of color, such light will be combined with light from other ones of the plurality of OLED devices to form a broadband illuminating light that appears to be more homogeneous throughout area of illumination 40.

In addition to forming a broadband illuminating light, the OLED devices 8 when viewed individually from any angle will be colored, since the light from any single point 38 on the OLED device 8 viewed from any illuminated point within area of illumination 40 will have a single color. Moreover, the color seen at each point on each OLED device 8 will change as the viewer moves, providing an aesthetic and dynamic rainbow light effect. Effectively, at any given illuminated point within the area of illumination 40, each OLED device 8 appears to be largely one color defined by the angle of the OLED device with respect to the illuminated substrate 30. While, in combination, multiple OLED devices 8 oriented at different angles that will emit different colors of light onto a single point and the multiple different colors will combine to provide a generally common range of broadband illumination of objects within area of illumination 40.

Such broadband light can comprise a multi-frequency combination of light that forms a generally white light or that forms any other desired combination of colors to provide a desired color temperature or CRI or to colorize the area of illumination.

OLED devices 8 may be constructed with an organic material that emits a narrowband light, for example green. Alternatively, the OLED devices 8 may be constructed with one or more layers of organic material 14 that emit a broadband light, for example white. The angular dependence can be achieved for both narrowband and broadband organic emitters by carefully structuring the optical elements of the OLED, for example by optimizing the distance between the electrodes 12, 16. Different OLED devices 8 can be arranged by support 50 at different angles and can have somewhat different ranges of colors emitted at different angles of emission to optimize the overall color of light output and the aesthetic effect of the OLED lamp. Applicants have for example, constructed both narrow-band and broadband light emitting OLED devices having a strong color dependence on angle of emission, for example from red to cyan.

Figure 3:
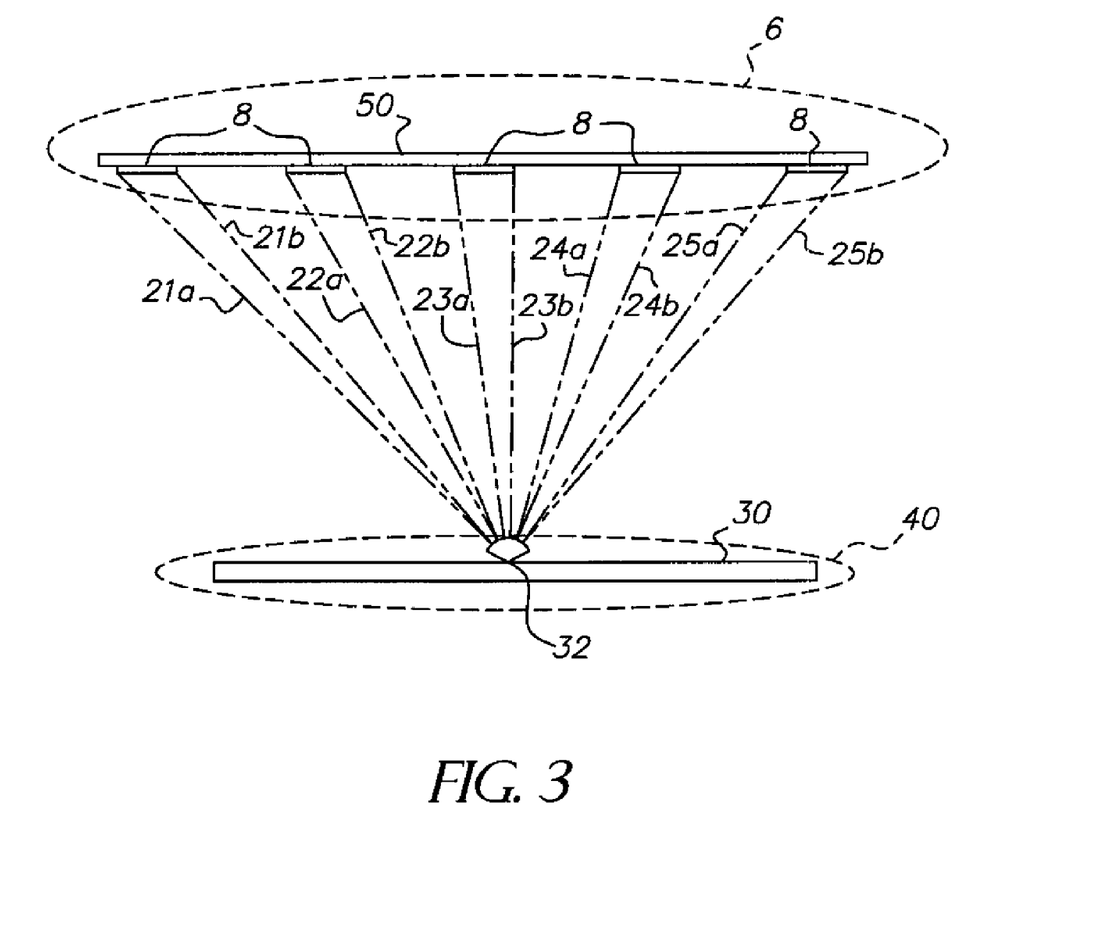
FIG. 3 illustrates surface illumination made by one embodiment of a solid-state illumination system.

It will be appreciated that support 50 can arrange OLED devices 8 in a variety of fashions. For example, FIG. 1 illustrates one embodiment of a solid-state illumination system 6 having OLED devices 8 that are not in a common plane and that have normals that are at an angle to each other, as well as to the illuminated point 32 on the surface 30. In contrast, FIG. 3 illustrates an alternative embodiment, wherein OLED devices 8 are in a common plane and have normals that are parallel to each other. However, because OLED devices 8 are located over an extended area whose size is comparable to, or smaller than, the distance from the common plane to illuminated surface 30, OLED devices are oriented at more than one different angle with respect to illuminated point 32 on surface 30. This kind of arrangement may be found, for example, in a large room with solid-state illumination system 6 mounted in the ceiling where the size of the floor and ceiling is much larger than the height of the ceiling from the floor.

Other embodiments of support 50 are illustrated in FIGS. 4 and 5 which illustrate by way of example only other embodiments of OLED devices 8 in solid-state illumination system 6 mounted at a variety of orientations in other supports 50. Supports 50 of the types illustrated in FIGS. 4 and 5 can be, for example, part of a floor lamp, table lamp, or ceiling mounted lamp such as a chandelier. Likewise, illumination system 6 may be employed for room lighting and the illuminated surface 30 may be, for example and not by way of limitation, a floor, wall, and/or ceiling. Additional light-controlling elements may be employed with illumination system 6, for example lumieres and shades. According to the present invention, the plurality of OLED devices 8 will be mounted at a variety of angles with respect to an illuminated point. It is preferred that the angle of the OLED device substrate normal also vary with respect to the illuminated substrate, since a plurality of different frequencies are required to illuminate a point to provide a broadband illumination. To provide such variation, it is preferred to provide an angular variation of at least 30% between the normal of at least two of the OLED devices 8, since the optical cavity length will vary with the inverse of the cosine of the angle. A variation of at least 60% between the normal of at least two of the OLED devices provide a wider frequency variation, for example up to a factor of 2. Note that the actual color variation will depend not only on the color of light emitted at a normal to the OLED device but also on the optical cavity modes.

In various embodiments of the present invention, an OLED device 8 may emit green-colored light in a direction normal to the OLED device. Alternatively, red, or blue light may be emitted, or other colors such as yellow or cyan. In other embodiments, the plurality of OLED devices may emit a plurality of different colors normal to the OLED device 8. Different colors of emission may be provided by employing different OLED materials 14 in the various OLED devices.

Substrate 10 and/or cover 20 of OLED device 8 may be rigid and made of glass or other rigid materials such as metal sheets. Alternatively, substrate 10 and/or cover 20 of OLED device 8 may be flexible and made of plastic or metal foil or other flexible materials. In some embodiments of the present invention, one or more OLED devices 8 may comprise a transparent substrate 10 and transparent cover 20 and may emit light from both sides of the OLED device. One or more of the OLED devices 8 may be either top- or bottom-emitting OLED devices. Means for manufacturing OLED devices in these configurations are known in the art.

A solid-state illumination system 6, such as the one described above in FIG. 1, can be made, for example, by forming a plurality of OLED devices on separate substrates, each OLED device emitting light at a plurality of angles relative to the substrate, said emitted light having different ranges of frequencies at different ranges of the plurality of angles; and providing a support for positioning the plurality of OLED devices at a plurality of orientations relative to an area of illumination, the positioning being defined so that any point on any surface within the area of illumination will receive a generally homogeneous broadband combination of light from more than one of the OLED devices.

In one embodiment, the invention is employed in an area illumination device that includes an Organic Light Emitting Diode (OLED) which is composed of small molecule or polymeric OLED materials as disclosed in, but not limited to, U.S. Pat. No. 4,769;292, issued Sep. 6, 1988 to Tang et al., and U.S. Pat. No. 5,061,569, issued Oct. 29, 1991 to VanSlyke et al. The light source may also include multiple light emitting layers as described in commonly assigned U.S. Application Publication No. 2003/0170491 filed Feb. 15, 2002 by Liao et al., the disclosure of which is incorporated herein by reference.

The invention has been described in detail with particular reference to certain preferred embodiments thereof, but it will be understood that variations and modifications can be effected within the spirit and scope of the invention.

PARTS LIST 6 solid-state area of illumination system
8, 8a, 8b OLED device
10 substrate
12 electrode
14 organic light emitting layer
16 electrode
18 power source
20 encapsulating cover
21, 21a, 21b light rays
22, 22a, 22b light rays
23, 23a, 23b light rays
24, 24a, 24b light rays
25, 25a, 25b light rays
30 illuminated surface
32 illuminated point
34 illuminated point
36 illuminated point
40 illuminated area
50 fixture
60 viewer
200 illumination system

The invention claimed is:

1. A solid-state illumination system for illuminating an area with white light comprising:
a plurality of OLED devices, each OLED device formed on a separate substrate having a light-emitting area and each OLED device emitting light at a plurality of angles relative to the substrate in the light-emitting area, said emitted light having different ranges of frequencies at different ranges of the plurality of angles, wherein each different range of frequencies corresponds to a single, different color emitted at each of the different ranges of angles over the substrate light-emitting area; with each OLED device including a first electrode formed over the substrate and a second electrode that in each OLED has a single, fixed distance from the first electrode over the substrate light-emitting area with at least one of the first electrode and second electrode having a surface that is at least partially reflective and having at least one layer of an unpatterned, common light emitting organic material formed between the first electrode and second electrode, said at least one light emitting organic material layer emitting light at a plurality of angles relative to the normal of at least one layer of organic material;

wherein the electrodes and the at least one layer of organic material are formed so that the distance that emitted light travels from the light emitting layer to the at least one partially reflective surface varies depending on the angle of emission so that the frequency of light emitted from the OLED device substrate light-emitting area to an illuminated surface depends upon the emission angle; and a support positioning the plurality of OLED devices at a plurality of orientations relative to an area of illumination, said positioning being defined so that any illuminated point within the area of illumination will receive a substantially common broadband combination of light selected to form white light from more than one of the plurality of OLED devices.

2. The solid-state area illumination system of claim 1, wherein the plurality of OLED devices are not located in a common plane.

3. The solid-state area illumination system of claim 1, wherein the plurality of OLED devices are located in a common plane.

4. The solid-state area illumination system of claim 1, wherein the illumination system is a chandelier, a table lamp, or a floor lamp.

5. The solid-state area illumination system of claim 1, wherein the illuminated surface is a floor, wall, ceiling, or item of furniture.

6. The solid-state area illumination system of claim 1, wherein at least one substrate is a rigid planar substrate.

7. The solid-state area illumination system of claim 1, wherein at least one substrate is flexible.

8. The solid-state area illumination system of claim 1, wherein at least one OLED device comprises a transparent substrate and transparent cover and light is emitted from both sides of the OLED device.

9. The solid-state area illumination system of claim 1, wherein the OLED devices emit broadband light.

10. The solid-state area illumination system of claim 1, wherein the OLED devices emit a single color of light in a direction normal to the surface of the substrate.

11. The solid-state area illumination system of claim 10, wherein the singe color of light emitted in a direction normal to the surface of the substrate is red, green, blue, yellow or cyan.

12. The solid-state area illumination system of claim 10, wherein the OLED devices are microcavity devices.

13. The solid-state area illumination system of claim 10, wherein at least one OLED device is a top-emitting OLED device.

14. The solid-state area illumination system of claim 10, wherein at least one OLED device is a bottom-emitting OLED device.

15. The solid-state area illumination system of claim 1, wherein at least two of the OLED devices radiate light at a different range of frequencies.

\* \* \* \* \*